(12) United States Patent
Kitazawa

(10) Patent No.: US 9,394,470 B2
(45) Date of Patent: Jul. 19, 2016

(54) SILICONE COMPOSITION

(71) Applicant: SHIN-ETSU CHEMICAL CO., LTD., Tokyo (JP)

(72) Inventor: Keita Kitazawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/844,724

(22) Filed: Sep. 3, 2015

(65) Prior Publication Data

US 2016/0068732 A1 Mar. 10, 2016

(30) Foreign Application Priority Data

Sep. 4, 2014 (JP) ................. 2014-180335

(51) Int. Cl.
| | |
|---|---|
| *C08L 83/04* | (2006.01) |
| *C09K 5/08* | (2006.01) |
| *H01L 23/36* | (2006.01) |
| *H01L 23/373* | (2006.01) |
| *C09K 5/14* | (2006.01) |
| *C08K 3/08* | (2006.01) |
| *C08K 3/22* | (2006.01) |

(52) U.S. Cl.
CPC . *C09K 5/08* (2013.01); *C08L 83/04* (2013.01); *C09K 5/14* (2013.01); *H01L 23/36* (2013.01); *H01L 23/3737* (2013.01); *C08K 2003/0812* (2013.01); *C08K 2003/2296* (2013.01); *C08K 2201/001* (2013.01); *C08L 2203/20* (2013.01); *C08L 2205/025* (2013.01); *C08L 2205/035* (2013.01)

(58) Field of Classification Search
None
See application file for complete search history.

(56) References Cited

U.S. PATENT DOCUMENTS

| | | | | |
|---|---|---|---|---|
| 5,021,494 | A * | 6/1991 | Toya ..................... | C08K 3/0033 524/404 |
| 6,649,258 | B2 | 11/2003 | Yamada et al. | |
| 6,844,314 | B2 * | 1/2005 | Eisenbach-Schwartz | A61K 38/16 424/184.1 |
| 7,547,743 | B2 * | 6/2009 | Goto ....................... | C08L 83/04 524/404 |
| 8,017,684 | B2 | 9/2011 | Endo et al. | |
| 8,211,545 | B2 | 7/2012 | Asaine | |
| 8,334,054 | B2 | 12/2012 | Endo et al. | |
| 8,383,005 | B2 * | 2/2013 | Tsuji ....................... | C09K 5/14 252/78.3 |
| 2002/0007035 | A1 * | 1/2002 | Nguyen ............... | B23K 35/025 528/10 |
| 2002/0018885 | A1 * | 2/2002 | Takahashi ............ | C10M 169/00 428/328 |
| 2015/0357261 | A1 * | 12/2015 | Tsuji ....................... | C08K 3/00 257/712 |
| 2016/0096984 | A1 * | 4/2016 | Matsumoto ............... | C09J 9/00 252/75 |

FOREIGN PATENT DOCUMENTS

| | | |
|---|---|---|
| JP | 2938428 B1 | 8/1999 |
| JP | 2938429 B1 | 8/1999 |
| JP | 3580366 B2 | 1/2007 |
| JP | 3952184 B2 | 8/2007 |
| JP | 2008-260798 A | 10/2008 |
| JP | 2009-209165 A | 9/2009 |
| JP | 4572243 B2 | 11/2010 |
| JP | 4656340 B2 | 3/2011 |
| JP | 4913874 B2 | 4/2012 |
| JP | 4917380 B2 | 4/2012 |
| JP | 2012-96361 A | 5/2012 |
| JP | 2012-102283 A | 5/2012 |
| JP | 4933094 B2 | 5/2012 |
| WO | WO 2014/105965 | * 7/2014 |

* cited by examiner

*Primary Examiner* — Marc Zimmer
(74) *Attorney, Agent, or Firm* — Birch, Stewart, Kolasch & Birch, LLP

(57) ABSTRACT

Provided is a silicone composition exhibiting a favorable adhesiveness even when containing a large amount of a thermal conductive filler. The silicone composition contains specific amounts of (A) an organopolysiloxane having at least two aliphatic unsaturated hydrocarbon groups in one molecule and exhibiting a kinetic viscosity of 60 to 100,000 mm$^2$/s at 25° C.;

(B) a silicone resin having at least one aliphatic unsaturated hydrocarbon group in one molecule;

(C) a filler including an aluminum powder and a zinc oxide powder;

(D) a organohydrogenpolysiloxane represented by the following general formula (1);

(E) a organohydrogenpolysiloxane represented by the following general formula (2);

(F) a hydrolyzable organopolysiloxane represented by the following general formula (3);

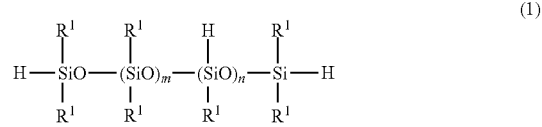

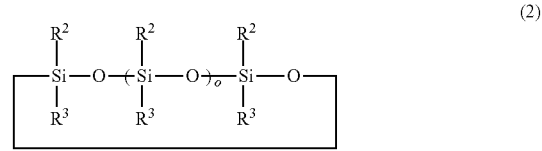

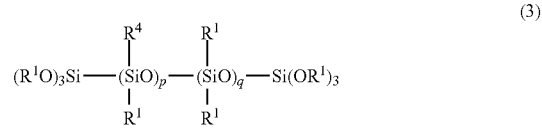

(G) a platinum group metal catalyst: effective amount; and
(H) a reaction control agent.

20 Claims, No Drawings

SILICONE COMPOSITION

BACKGROUND OF THE INVENTION

1. Field of the Invention

The present invention relates to a silicone composition. Particularly, the invention relates to a silicone composition from which a highly thermal conductive silicone grease can be made, and a silicone composition from which a grease exhibiting a favorable adhesiveness can be made even when containing a large amount of a thermal conductive filler.

2. Background Art

It is widely known that electronic parts such as LSI and IC chips generate heat in use and thereby undergo performance degradation. A variety of heat dissipation techniques have been used to solve this problem. As a general heat dissipation technique, there has been proposed a method where a cooling member is placed in the vicinity of a heat generating part, and heat dissipation is then performed by efficiently removing the heat through the cooling member with the two being in close contact with each other.

DESCRIPTION OF RELATED ART

At that time, if there exists a clearance between the heat generating part and the cooling member, the thermal conductivity will decrease due to an air present therebetween and inferior in thermal conductivity. Thus, the temperature of the heat generating part cannot be decreased sufficiently. In order to improve the thermal conductivity by avoiding such air, there has been used a heat dissipation material such as a heat dissipation grease or sheet conformable to the surface of any member (Japanese Patents No. 2938428, No. 2938429, No. 3580366, No. 3952184, No. 4572243, No. 4656340, No. 4913874, No. 4917380, No. 4933094; JP-A-2008-260798, 2009-209165)

For example, Japanese Patent No. 4933094 discloses a thermal conductive silicone grease composition containing an organopolysiloxane having a specific structure, an alkoxysilane having a specific substituted group and a thermal conductive filler. According to Japanese Patent No. 4933094, this composition exhibits a favorable thermal conductivity and fluidity such that a superior workability is achieved. Further, JP-A-2008-260798 and JP-A-2009-209165 disclose a sheet having an adhesiveness and thermal conductivity; and a thermal conductive composition obtained by adding to an addition curable silicone rubber composition a thermal conducive filler and a silicone resin having no aliphatic unsaturated hydrocarbon group. The JP-A-2008-260798 and JP-A-2009-209165 disclose that there can be provided a thermal conductive cured product that is formed into the shape of a thin film and exhibits a moderate adhesiveness as well as a favorable thermal conductivity.

Among heat dissipation greases, some are given an adhesion property for solidly bonding a semiconductor chip and a heat spreader to each other. This is because when the semiconductor chip and the heat spreader are not sufficiently bonded to each other through the grease, a heat dissipation function will be exhibited in an insufficient manner such that a significant performance degradation may occur. Therefore, it is critical to solidly bond the semiconductor chip and the heat spreader to each other with a grease. However, it is also required that a large amount of a thermal conductive filler be used for the purpose of improving the thermal conductivity of a heat dissipation grease. When a grease is filled with a large amount of a thermal conductive filler, there exists a problem where the adhesiveness of a cured product obtained will decrease. A decreased adhesiveness may lead to the peeling of the cured product as the captioned cured product fails to conform with the semiconductor chip deformed through a thermal history of heat generation and cooling. There, the semiconductor chip may even be damaged in a worst-case situation.

JP-A-2012-102283 discloses a thermal conductive silicone grease composition containing, as essential components, an organopolysiloxane having an alkenyl group(s), a hydrolyzable methylpolysiloxane, a thermal conductive filler, an organohydrogenpolysiloxane, an adhesion aid having a triazine ring(s) and an alkenyl group(s) and a platinum based catalyst. JP-A-2012-102283 discloses that such composition exhibits a small degree of hardness increase after being cured and then subjected to thermal aging in a high temperature environment, and that there can thus be provided a heat dissipation grease whose spreadability is restricted from being decreased. JP-A-2012-96361 discloses a thermal conductive silicone composition containing, as a curing agent, a peroxide whose 10 hour half-life temperature is not less than 80° C. but less than 130° C. According to JP-A-2012-96361, this composition can provide a heat dissipation grease that can be easily cured on a substrate surface having a noble metal layer such as gold.

SUMMARY OF THE INVENTION

As described above, in recent years, high-grade semiconductor devices have generated increasingly large amounts of heat during their operations. Problems with conventional greases are that their thermal conductivities are insufficient, and that while their thermal conductivities may be high, their adhesions are low. Thus, it is an object of the present invention to provide a silicone composition from which a silicone grease with a high thermal conductivity and a favorable adhesion can be produced.

In view of the aforementioned situations, the inventors completed the present invention after diligently conducting a number of studies. Specifically, the inventors found that there could be produced a silicone grease having a favorable adhesion even when containing a large amount of a thermal conductive filler, by adding a silicone composition containing particular amounts of an organopolysiloxane having an aliphatic unsaturated hydrocarbon group(s); a silicone resin having an aliphatic unsaturated hydrocarbon group(s); a thermal conducive filler; an organohydrogenpolysiloxane having a specific structure; a platinum group metal catalyst and the like.

<1> The present invention provides a silicone composition including:

(A) an organopolysiloxane having at least two aliphatic unsaturated hydrocarbon groups in one molecule and exhibiting a kinetic viscosity of 60 to 100,000 mm$^2$/s at 25° C., the organopolysiloxane being in an amount of 100 parts by mass;

(B) a silicone resin having at least one aliphatic unsaturated hydrocarbon group in one molecule, the silicone resin being in an amount of 0 to 100 parts by mass with respect to 100 parts by mass of the component (A);

(C) a filler including an aluminum powder and a zinc oxide powder, the filler being in an amount of 100 to 2,000 parts by mass with respect to 100 parts by mass of a sum total of the components (A) and (B);

(D) an organohydrogenpolysiloxane represented by the following general formula (1):

(Chemical formula 1)

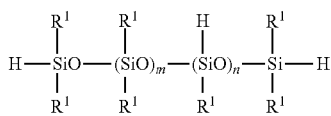
(1)

(wherein n and m satisfy 5.0≤n+m≤100, n/(n+m)≤0.5 and 0.5≤n/(number of SiH groups present in terminal end groups i.e. 2)≤10; each $R^1$ independently represents an alkyl group having 1 to 6 carbon atoms);

(E) an organohydrogenpolysiloxane represented by the following general formula (2):

(Chemical formula 2)

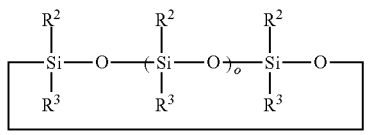
(2)

(wherein o represents an integer of 2 to 8; each $R^2$ independently represents a hydrogen atom or $R^4$, provided that 2 to 3 of the groups represented by $R^2$ are hydrogen atoms; the $R^4$ is a group selected from an epoxyalkoxyalkyl group, an acryloyl group, a methacryloyl group and a trialkoxysilyl group; each $R^3$ independently represents an alkyl group having 1 to 6 carbon atoms);

(F) a hydrolyzable organopolysiloxane represented by the following general formula (3):

(Chemical formula 3)

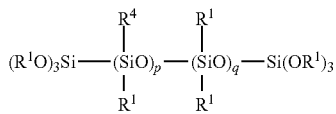
(3)

(wherein p and q satisfy 5.0≤p+q≤100; each R' independently represents an alkyl group having 1 to 6 carbon atoms; $R^4$ represents an alkenyl group having 2 to 6 carbon atoms), the hydrolyzable organopolysiloxane being in an amount of 1 to 50 parts by mass with respect to 100 parts by mass of the sum total of the components (A) and (B);

(G) a platinum group metal catalyst of an effective amount; and (H) a reaction control agent of an amount of 0.05 to 5.0 parts by mass, wherein a total amount of the components (D) and (E) is such that (total number of SiH groups in components (D) and (E))/(total number of aliphatic unsaturated hydrocarbon groups in components (A), (B) and (F)) is in a range of 1.0 to 3.0; and that (number of SiH groups in component (D))/(number of SiH groups in components (D) and (E)) is in a range of 0.2 to 0.8.

<2> The silicone composition according to <1>, further including (I) a hydrolyzable methylpolysiloxane represented by the following general formula (4):

(Chemical formula 4)

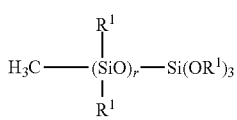
(4)

(wherein each $R^1$ independently represents an alkyl group having 1 to 6 carbon atoms; r represents an integer of 5 to 100), the hydrolyzable methylpolysiloxane being in an amount of 1 to 50 parts by mass with respect to 100 parts by mass of the sum total of the components (A) and (B).

<3> The silicone composition according to <1> or <2>, further comprising (J) an adhesion aid having, in one molecule, a triazine ring and at least one aliphatic unsaturated hydrocarbon group that may contain an oxygen atom, the adhesion aid being in an amount of 0.05 to 0.5 parts by mass with respect to 100 parts by mass of the sum total of the components (A) and (B).

<4> The silicone composition according to any one of <1> to <3>, wherein the silicone resin (B) includes an $SiO_{4/2}$ unit, an $R^5_2R^6SiO_{1/2}$ unit and an $R^5_3SiO_{1/2}$ unit (each $R^5$ independently represents a monovalent hydrocarbon group having no aliphatic unsaturated bond; $R^6$ represents an aliphatic unsaturated hydrocarbon group), and (total number of $R^5_2R^6SiO_{1/2}$ and $R^5_3SiO_{1/2}$ units)/(number of $SiO_{4/2}$ units) is in a range of 0.1 to 3.0.

<5> The silicone composition according to any one of <1> to <4>, wherein the reaction control agent (H) is selected from the group consisting of an acetylene compound, a nitrogen compound, an organic phosphorous compound, an oxime compound and an organic chloro compound.

<6> The silicone composition according to any one of <1> to <5>, wherein the organopolysiloxane (A) has a linear structure in which a main chain consists of recurring units of diorganosiloxane, and both molecular chain terminal ends are blocked by triorganosiloxy groups.

<7> The silicone composition according to any one of <1> to <6>, wherein the silicone resin (B) has an aliphatic unsaturated hydrocarbon group in an amount of $1×10^{-5}$ to $1×10{-2}$ mol/g.

<8> The silicone composition according to any one of <1> to <7>, wherein the zinc oxide powder of the filler (C) has an average particle diameter of 0.1 to 10 μm; and the aluminum powder of the filler (C) is a mixed aluminum powder of an aluminum powder having a large average particle diameter of 5 μm to 100 μm and an aluminum powder having a small average particle diameter of not smaller than 0.1 μm but smaller than 10 μm, a mass ratio of the aluminum powder having the large average particle diameter to the aluminum powder having the small average particle diameter being 0.5 to 9.0.

<9> The silicone composition according to any one of <1> to <8>, wherein a mass ratio of the aluminum powder to the zinc oxide powder of the filler (C), (aluminum powder)/(zinc oxide powder), is in a range of 1 to 10.

Since the silicone composition of the present invention is able to exhibit a favorable adhesiveness even when containing a large amount of a thermal conductive filler, there can be provided a silicone grease having a high thermal conductivity and a favorable adhesiveness.

DETAILED DESCRIPTION OF THE INVENTION

A detailed description of the present invention is presented below.

Component (A)

A component (A) is an organopolysiloxane having at least two aliphatic unsaturated hydrocarbon groups in one molecule and exhibiting a kinetic viscosity of 60 to 100,000 mm$^2$/s at 25° C.

It is preferred that the aliphatic unsaturated hydrocarbon group(s) be a monovalent hydrocarbon group having an aliphatic unsaturated bond and 2 to 8, more preferably 2 to 6 carbon atoms. It is even more preferred that the aliphatic unsaturated hydrocarbon group(s) be an alkenyl group of such kind. Examples of such aliphatic unsaturated hydrocarbon group include alkenyl groups such as a vinyl group, an allyl group, a propenyl group, an isopropenyl group, a butenyl group, a hexenyl group, a cyclohexenyl group and an octenyl group. Particularly, a vinyl group is preferred. The aliphatic unsaturated hydrocarbon group may be bonded to a silicon atom at the terminal end(s) of a molecular chain; a silicon atom at any portion along the molecular chain; or silicon atoms of both types.

It is preferred that the organopolysiloxane as the component (A) exhibit a kinetic viscosity of 60 to 100,000, particularly 100 to 30,000 mm$^2$/s at 25° C. When such kinetic viscosity is below 60 mm$^2$/s, physical properties of the silicone composition may be impaired. Meanwhile, a kinetic viscosity greater than 100,000 mm$^2$/s may lead to a poor extensibility of the silicone composition. In the present invention, the kinetic viscosity is a value obtained through a measurement with an Ubbelohde-type Ostwald viscometer at 25° C. Those skilled in the art can easily synthesize an organopolysiloxane whose kinetic viscosity is within the above range, or there may be used an organopolysiloxane that is commercially available.

No particular limitation is imposed on the molecular structure of the organopolysiloxane as the component (A), as long as such organopolysiloxane has the aforementioned properties. For example, the organopolysiloxane may have a linear structure, a branched structure or a linear structure that is either partially branched or has a cyclic structure. Particularly, it is preferred that the organopolysiloxane have a linear structure where a main chain consists of recurring units of diorganosiloxane, and both terminal ends of its molecular chain are blocked by a triorganosiloxy group(s). The organopolysiloxane having such linear structure may partially include a branched structure or a cyclic structure. In fact, not only one kind, but two or more kinds of such organopolysiloxane may be used in combination.

As for the organopolysiloxane as the component (A), an organic group other than an aliphatic unsaturated hydrocarbon group may be bonded to a silicon atom of the organopolysiloxane. An organic group other than an aliphatic unsaturated hydrocarbon group in such case may be an unsubstituted or substituted monovalent hydrocarbon group having 1 to 18, preferably 1 to 10, and more preferably 1 to 8 carbon atoms. Examples of such monovalent hydrocarbon group include an alkyl group such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group and a decyl group; an aryl group such as a phenyl group, a tolyl group, a xylyl group and a naphthyl group; an aralkyl group such as a benzyl group, a phenylethyl group and a phenylpropyl group; or those obtained by substituting a part or all of the hydrogen atoms in the aforementioned groups with, for example, a cyano group or a halogen atom such as a fluorine atom, a bromine atom and a chlorine atom (e.g. a chloromethyl group, a chloropropyl group, a bromoethyl group, a trifluoropropyl group and a cyanoethyl group). A methyl group is preferable above all.

Component (B)

A component (B) is a silicone resin. The silicone resin as the component (B) has at least one aliphatic unsaturated hydrocarbon group in one molecule. Since the silicone composition of the present invention contains such silicone resin, the adhesive strength of a cured product obtained can be improved significantly.

In the present invention, it is preferred that the component (B) be a silicone resin having an SiO$_{4/2}$ unit, an R$^5_2$R$^6$SiO$_{1/2}$ unit and an R$^5_3$SiO$_{1/2}$ unit (in the formulas, each R$^5$ independently represents a monovalent hydrocarbon group having no aliphatic unsaturated bond; and R$^6$ represents an aliphatic unsaturated hydrocarbon group.)

In the above formulas, each R$^5$ independently represents an unsubstituted or substituted monovalent hydrocarbon group having 1 to 18, preferably 1 to 10, and more preferably 1 to 8 carbon atoms. Examples of R$^5$ include an alkyl group such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group and a decyl group; an aryl group such as a phenyl group, a tolyl group, a xylyl group and a naphthyl group; an aralkyl group such as a benzyl group, a phenylethyl group and a phenylpropyl group; or those obtained by substituting a part or all of the hydrogen atoms in the aforementioned groups with, for example, a cyano group or a halogen atom such as a fluorine atom, a bromine atom and a chlorine atom (e.g. a chloromethyl group, a chloropropyl group, a bromoethyl group, a trifluoropropyl group and a cyanoethyl group). A methyl group is preferable above all.

R$^6$ is an aliphatic unsaturated hydrocarbon group, preferably a monovalent hydrocarbon group or more preferably an alkenyl group having an aliphatic unsaturated bond(s) and 2 to 8, preferably 2 to 6 carbon atoms. Examples of such alkenyl group include a vinyl group, an allyl group, a propenyl group, an isopropenyl group, a butenyl group, a hexenyl group, a cyclohexenyl group and an octenyl group. Particularly, a vinyl group is preferred.

The silicone resin as the component (B) has at least one aliphatic unsaturated hydrocarbon group in one molecule, in an amount of $1\times10^{-5}$ to $1\times10^{-2}$ mol/g, preferably $1\times10^{-4}$ to $2\times10^{-3}$ mol/g.

Further, it is preferred that the component (B) be used in an amount satisfying a molar ratio of (M unit)/(Q unit) of 0.1 to 3.0, preferably 0.3 to 2.5, particularly preferably 0.5 to 2.0, provided that Q unit represents the SiO$_{4/2}$ unit and that M unit represents the R$^5_2$R$^6$SiO$_{1/2}$ unit and R$^5_3$SiO$_{1/2}$ unit. When the molar ratio between the M unit and the Q unit is within the above range, there can be provided a grease exhibiting a favorable adhesiveness and strength. In addition, the silicone resin of the present invention may contain an R$_2$SiO$_{2/2}$ unit (D unit) and an RSiO$_{3/2}$ unit (T unit) in a molecule to an extent that the properties of the composition of the present invention will not be impaired (wherein, R is R$^5$ or R$^6$)

The silicone resin used in the present invention is a solid or a viscous liquid at a room temperature. Here, there are no particular restrictions on an average molecular weight of the silicone resin. However, it is preferred that the molecular weight be such a value that a kinetic viscosity reaches 0.5 to 10 mm$^2$/s, preferably 1.0 to 5.0 mm$^2$/s when such silicone resin is dissolved in xylene to obtain a solution of 50% by mass. This kinetic viscosity is a value measured by an Ubbelohde-type Ostwald viscometer at 25° C. It is preferred that the viscosity of the silicone resin be within the above range, because the physical properties of the composition can be prevented from being impaired in such case.

The silicone resin as the component (B) is used in an amount of 0 to 100 parts by mass, preferably 2 to 100 parts by mass, more preferably 10 to 70 parts by mass with respect to 100 parts by mass of the component (A). When the amount of the component (B) is less than the above lower limit, it may be insufficient to exhibit the adhesiveness. Further, when the amount of the component (B) is greater than the above upper limit, a poor extensibility may be exhibited.

Component (C)

A component (C) is a thermal conductive filler containing an aluminum powder and a zinc oxide powder. In the present invention, there are no particular restrictions on the shape of the aluminum powder. In fact, the aluminum powder may have, for example, a spherical shape or an indefinite shape. Moreover, the aluminum powder may be a type of powder that has been surface-treated beforehand. It is preferred that the aluminum powder have an average particle diameter of 0.1 to 100 µm, more preferably 1 to 40 µm. When the aluminum powder exhibits an average particle diameter of not smaller than 0.1 µm, the viscosity of the composition obtained will not be excessively high, and there will not be achieved a poor extensibility accordingly. An average particle diameter not larger than 100 µm leads to a uniform composition obtained. Particularly, the average particle diameter in this description refers to a particle diameter at an integrated value of 50% in a volume-based grain size distribution obtained by a laser diffraction/scattering method. Here, the measurement employing the laser diffraction/scattering method was performed by a microtrack particle size analyzer MT3300EX (by Nikkiso Co., Ltd.).

As for the aluminum powder used in the present invention, there may be used singularly either an aluminum powder having a large average particle diameter or an aluminum powder having a small average particle diameter. However, it is preferred that there be used a mixed aluminum powder of an aluminum powder having a large average particle diameter (e.g. 5 µm to 100 µm, preferably 10 µm to 100 µm, more preferably 10 µm to 50 µm); and an aluminum powder having a small average particle diameter (e.g. not smaller than 0.1 µm but smaller than 10 µm, preferably 0.1 µm to 5 µm, more preferably 1 µm to 5 µm). A blend ratio of these aluminum powders can be controlled in accordance with a desired viscosity of the grease. However, it is preferred that a mass ratio of the aluminum powder having a large average particle diameter to the aluminum powder having a small average particle diameter be 0.5 to 9.0, particularly preferably 1.0 to 5.0. Further, the composition of the present invention will exhibit an even more favorable viscosity, as a result of using the zinc oxide powder and the two kinds of the aluminum powders with different average particle diameters, as the (C) filler of the silicone composition of the present invention. Thus, a grease made of such composition also has a favorable viscosity as well.

In the present invention, there are no particular restrictions on the shape of the zinc oxide powder. In fact, the zinc oxide powder may have, for example, a spherical shape or an indefinite shape. It is preferred that the zinc oxide powder have an average particle diameter of 0.1 to 10 µm, more preferably 1 to 4 µm. When the average particle diameter of the zinc oxide powder is not smaller than 0.1 µm, there only exists a small possibility that the viscosity of the silicone composition obtained will become excessively high, and that there will be achieved a poor extensibility accordingly. Further, an average particle diameter not larger than 10 µm leads to a uniform silicone composition obtained.

When a mass ratio of the aluminum powder to the zinc oxide powder, (Aluminum powder)/(Zinc oxide powder), is smaller than 1, there will be achieved a poor thermal conductivity of the composition obtained. Further, when such mass ratio is larger than 10, oil separation will take place intensely with time. For these reasons, it is preferred that this mass ratio be 1 to 10, particularly preferably 2 to 8.

In the present invention, other than the aluminum powder and the zinc oxide powder, the (C) filler may further contain a known thermal conductive filler such as a titanium oxide powder, an alumina powder, a boron nitride powder, an aluminum nitride powder, a diamond powder, a gold powder, a silver powder, a copper powder, a carbon powder, a nickel powder, an indium powder, a gallium powder, a metallic silicon powder and a silica powder, according to an intended use.

The (C) filler is used in an amount of 100 to 2,000 parts by mass, preferably 200 to 1,800 parts by mass, more preferably 400 to 1,800 parts by mass with respect to 100 parts by mass of a sum total of the components (A) and (B). When the amount of the filler is smaller than 100 parts by mass, there may be achieved a poor thermal conductivity of the composition obtained. Meanwhile, an amount greater than 2,000 parts by mass may lead to a composition exhibiting a poor extensibility.

Component (D)

A component (D) is an organohydrogenpolysiloxane represented by the following general formula. As for such organohydrogenpolysiloxane, SiH groups in the molecule undergo an addition reaction with the aliphatic unsaturated hydrocarbon groups in the composition under the presence of a later-described platinum group metal catalyst, such that a cross-linked structure is formed.

(Chemical formula 5)

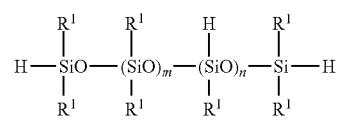

(1)

(In the formula (1), "n" and "m" satisfy $5.0 \leq n+m \leq 100$, $n/(n+m) \leq 0.5$, and $0.5 \leq n/$(number of SiH groups present in terminal end groups i.e. $2) \leq 10$; and each $R^1$ independently represents an alkyl group having 1 to 6 carbon atoms)

It is essential that this organohydrogenpolysiloxane has the SiH groups at both the terminal ends of the molecular chain and any portion of the molecular chain. If using an organohydrogenpolysiloxane only having the SiH groups at either the terminal ends of the molecular chain or anywhere else along the molecular chain, the adhesiveness of the silicone composition may become insufficient.

Moreover, it is required that "n" and "m" in the formula (1) satisfy $5.0 \leq n+m \leq 100$, preferably $10 \leq n+m \leq 80$. When n+m is less than 5.0, the physical properties of the silicone composition may be impaired. When n+m is greater than 100, there may be obtained a silicone composition exhibiting a poor extensibility. Further, "n" and "m" must satisfy $n/(n+m) \leq 0.5$, preferably $n/(n+m) \leq 0.3$. When $n/(n+m)$ is larger than 0.5, the adhesiveness of the silicone composition may be impaired. Furthermore, "n" satisfies $0.5 \leq n/$(number of SiH groups present in terminal end groups i.e. $2) \leq 10$, preferably $1.0 \leq n/$ (number of SiH groups present in terminal end groups i.e. 2)≤8.0. When n/(number of SiH groups present in terminal end groups i.e. 2) is either smaller than 0.5 or larger than 10, the adhesiveness of the silicone composition may be impaired.

In the formula (1), each $R^1$ independently represents an alkyl group having 1 to 6 carbon atoms. Examples of such alkyl group include a methyl group, an ethyl group, a propyl group, an isopropyl group, a butyl group, a sec-butyl group, a tert-butyl group, a pentyl group and a hexyl group.

In fact, not only one kind, but two or more kinds of the organohydrogenpolysiloxane as the component (D) may be used in combination.

Component (E)

A component (E) is an organohydrogenpolysiloxane represented by the following general formula (2). As for such organohydrogenpolysiloxane, SiH groups in the molecule undergo an addition reaction with the aliphatic unsaturated hydrocarbon groups in the composition under the presence of a later-described platinum group metal catalyst, such that a cross-linked structure is formed. This organohydrogenpolysiloxane further endows the silicone composition with an adhesiveness.

(Chemical formula 6)

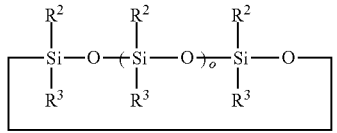

(2)

(In the formula (2), "o" represents an integer of 2 to 8; each $R^2$ independently represents a hydrogen atom or $R^4$, provided that 2 to 3 of the groups represented by $R^2$ are hydrogen atoms. The aforementioned $R^4$ is a group selected from an epoxyalkoxyalkyl group, an acryloyl group, a methacryloyl group and a trialkoxysilyl group; each $R^3$ independently represents an alkyl group having 1 to 6 carbon atoms.)

In the formula (2), each $R^2$ independently represents a hydrogen atom or $R^4$, provided that 2 to 3 of the groups represented by $R^2$ are hydrogen atoms. The aforementioned $R^4$ is a group selected from an epoxyalkoxyalkyl group, an acryloyl group, a methacryloyl group and a trialkoxysilyl group. Further, the $R^4$ has an effect of endowing the silicone composition with an adhesiveness. Moreover, each $R^3$ independently represents an alkyl group having 1 to 6 carbon atoms. Examples of such $R^3$ include a methyl group, an ethyl group, a propyl group, an isopropyl group, a butyl group, a sec-butyl group, a tert-butyl group, a pentyl group and a hexyl group.

In fact, not only one kind, but two or more kinds of such organohydrogenpolysiloxane may be used in a mixed manner.

It is preferred that a sum total of the organohydrogenpolysiloxanes as the components (D) and (E) be in an amount where (total number of SiH groups in components (D) and (E))/(total number of aliphatic unsaturated hydrocarbon groups in components (A), (B) and (F)) becomes 1.0 to 3.0, more preferably 1.5 to 2.5. When the amount of the components (D) and (E) is below such lower limit, an insufficient adhesiveness is exhibited such that a poor adhesion to a substrate may be achieved. Further, an amount greater than such upper limit may cause the unreacted SiH groups to undergo an excessive cross-linking reaction such that the hardness of a cured product may increase.

Moreover, it is preferred that (number of SiH groups in component (D))/(number of SiH groups in components (D) and (E)) be 0.2 to 0.8, more preferably 0.3 to 0.7. When (number of SiH groups in component (D))/(number of SiH groups in components (D) and (E)) is below such lower limit, the physical properties of the silicone composition may be impaired. Also, when (number of SiH groups in component (D))/(number of SiH groups in components (D) and (E)) is greater than such upper limit, an insufficient adhesiveness is exhibited such that a poor adhesion to a substrate may be achieved.

Component (F)

A component (F) is a hydrolyzable organopolysiloxane represented by the following general formula (3). This organopolysiloxane is to endow a wettability with respect to the thermal conducive filler; and endow the silicone composition with an adhesiveness.

(Chemical formula 7)

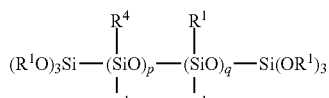

(3)

(In the formula (3), "p" and "q" satisfy 5.0≤p+q≤100; each $R^1$ independently represents an alkyl group having 1 to 6 carbon atoms; $R^4$ represents an alkenyl group having 2 to 6 carbon atoms.)

In the formula (3), although "p" and "q" satisfy 5.0≤p+q≤100, it is preferred that "p" and "q" satisfy 5.0≤p+q≤60. When p+q is less than 5.0, oil bleed from the silicone composition becomes severe such that an unfavorable reliability may be achieved. Further, when p+q is larger than 100, there may be exhibited an insufficient wettability with respect to the filler.

In the formula (3), each $R^1$ independently represents an alkyl group having 1 to 6 carbon atoms. Examples of such alkyl group include a methyl group, an ethyl group, a propyl group, an isopropyl group, a butyl group, a sec-butyl group, a tert-butyl group, a pentyl group and a hexyl group. Moreover, $R^4$ represents an alkenyl group having 2 to 6 carbon atoms. Examples of such alkenyl group include a vinyl group, an allyl group, a propenyl group, an isopropenyl group, a butenyl group, a hexenyl group and a cyclohexenyl group.

The component (F) is used in an amount of 1 to 50 parts by mass, preferably 10 to 30 parts by mass with respect to 100 parts by mass of the sum total of the components (A) and (B). When the amount of the component (F) is below such lower limit, there may be achieved an insufficient wettability and adhesiveness. Further, when the amount of the component (F) is greater than such upper limit, the composition may bleed intensely.

Component (G)

A component (G) is a platinum group metal catalyst used to facilitate the addition reaction of the aforementioned components. As such platinum group metal catalyst, there may be used a known platinum group metal catalyst for use in addition reaction. Examples of such platinum group metal catalyst include a platinum-based catalyst, a palladium-based catalyst and a rhodium-based catalyst among which platinum or a platinum compound is preferred due to a relatively easy access thereto. For example, there may be used elemental platinum, platinum black, chloroplatinic acid, a platinum-olefin complex, a platinum-alcohol complex and a platinum coordination compound. In fact, not only one kind, but two or more kinds of such platinum-based catalyst can be used in combination.

The amount of the component (G) added may simply be an effective amount as a catalyst. That is, the component (G) may be added in an effect amount required to facilitate the addition reaction and cure the composition of the present invention. It is preferred that the component (G) be used in an amount of 0.1 to 500 ppm, more preferably 1 to 200 ppm in terms of platinum group metal atom, with respect to a total mass of the components (A) and (B). When the amount of the catalyst is below such lower limit, there may not be achieved the effects as a catalyst. Also, an amount greater than such upper limit is not preferable either, because the catalytic effects will not be improved in such case with a wasteful amount of the catalyst being used.

Component (H)

A component (H) is a control agent for controlling the progression of a hydrosilylation reaction at a room temperature. The component (H) is added to extend a shelf life and a pot life. As such control agent, there can be used a known control agent for use in an addition-curable silicone composition. Examples of such control agent include acetylene compounds such as acetylene alcohols (e.g. ethynylmethyl-decylcarbinol, 1-ethynyl-1-cyclohexanol and 3,5-dimethyl-1-hexine-3-ol); various nitrogen compounds such as tributylamine, tetramethylethylenediamine and benzotriazole; organic phosphorous compounds such as triphenylphosphine; oxime compounds; and organic chloro compounds.

The component (H) is used in an amount of 0.05 to 5.0 parts by mass, preferably 0.1 to 1.0 parts by mass with respect to 100 parts by mass of the sum total of the components (A) and (B). When the amount of the control agent is smaller than 0.05 parts by mass, there may not be achieved a sufficient shelf life and pot life as desired. Further, when the amount of the control agent is greater than 5.0 parts by mass, the curability of the silicone composition may be impaired. Also, in order to improve its dispersibility to the silicone composition, the control agent may be diluted with an organo (poly) siloxane, a toluene or the like before use.

The following components other than the aforementioned components can be arbitrarily added to the silicone composition of the present invention if necessary.

Component (I)

The silicone composition of the present invention may further contain a hydrolyzable methylpolysiloxane represented by the following formula (4).

(Chemical formula 8)

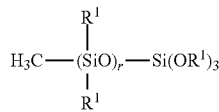

(4)

(In the above formula, each $R^1$ independently represents an alkyl group having 1 to 6 carbon atoms; "r" represents an integer of 5 to 100.)

In the above formula (4), each $R^1$ independently represents an alkyl group having 1 to 6 carbon atoms. Examples of such alkyl group include a methyl group, an ethyl group, propyl group, isopropyl group, butyl group, sec-butyl group, tert-butyl group, pentyl group and a hexyl group. "r" represents an integer of 5 to 100, preferably 10 to 60. When the value of "r" is smaller than 5, oil bleed from the silicone composition becomes severe such that there may be achieved an unfavorable reliability.

It is preferred that the component (I) be added in an amount of 1 to 50 parts by mass, particularly preferably 10 to 30 parts by mass with respect to 100 parts by mass of the sum total of the components (A) and (B). When the amount of the component (I) is smaller than 1 part by mass, there may be exhibited an insufficient wettability. Further, when the amount of the component (I) is greater than 50 parts by mass, the composition may bleed intensely.

Component (J)

The silicone composition of the present invention may further contain an (J) adhesion aid. Such adhesion aid is a compound having, in one molecule, a triazine ring and at least one aliphatic unsaturated hydrocarbon group that may contain an oxygen atom(s). The adhesion aid is able to improve the adhesiveness of the composition.

Represented by the following general formula (5) is an example of the component (J).

(Chemical formula 9)

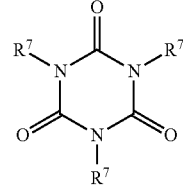

(5)

In the formula (5), $R^7$ represents either an aliphatic unsaturated hydrocarbon group that may contain an oxygen atom(s); or a group indicated by $-(CH_2)_s-Si(OR^8)_3$ (in the above formula, $R^8$ represents a hydrogen atom or a monovalent hydrocarbon atom having 1 to 6 carbon atoms; "s" represents an integer of 1 to 6, preferably 1 to 4). However, at least one $R^7$ is an aliphatic unsaturated hydrocarbon group. $R^7$ is a linear or branched alkenyl group preferably having 2 to 8, more preferably 2 to 6 carbon atoms. Examples of such $R^7$ include a vinyl group, an allyl group, 1-butenyl group, 1-hexenyl group, 2-methylpropenyl group and a (meth)acrylic group. An allyl group is preferred above all in terms of cost. Examples of the component (J) include alkoxysilyl-substituted triallyl isocyanurates with 1 to 2 alkoxysilyl groups such as trimethoxysilyl groups being added to 1 to 2 allyl groups of triallyl isocyanurate, trimethacryl isocyanurate and triallyl isocyanurate; and siloxane-modified products (derivatives) as hydrolysis condensates of such alkoxysilyl-substituted triallyl isocyanurates. The component (J) is added in an amount of 0.05 to 0.5 parts by mass, preferably 0.05 to 0.3 parts by mass with respect to 100 parts by mass of the sum total of the components (A) and (B). When the amount of the component (J) is smaller than such lower limit, the composition may not exhibit a sufficient adhesiveness. Also, when the amount of the component (J) is greater than such upper limit, the addition reaction may not proceed in a sufficient manner such that an adhesiveness may not be exhibited.

Other Components

The silicone composition of the present invention may also contain a nonreactive organo (poly) siloxane such as a methylpolysiloxane for the purpose of controlling an elastic modulus and viscosity of the composition. Further, the silicone composition may also contain, if necessary, a known antioxidant such as 2,6-di-t-butyl-4-methylphenol for the purpose of preventing the deterioration of the silicone composition. Furthermore, there may also be added, for example, a dye, a pigment, a flame retardant, an antisettling agent or a thixotropy improver if necessary.

Steps for Producing Silicone Composition

Described hereunder is a production method of the thermal conductive silicone composition of the present invention. However, such production method is not limited to the one described below.

The production method of the thermal conductive silicone composition of the present invention includes steps for producing the silicone composition containing the components (A) to (H); and the components (I) and/or (J) if necessary.

In fact, there are no particular restrictions on the production method of the silicone composition of the present invention, as long as the method complies with a conventional method for producing a silicone grease composition. For example, the silicone composition can be produced by a method of mixing together the components (A) to (H) and other components if needed, by means of Tri-Mix, Twin-Mix, Planetary Mixer (all are registered trademarks of mixers by Inoue Mfg., Inc); Ultra Mixer (registered trademark of mixer by Mizuho Industrial Co., Ltd); Hivis Disper Mix (registered trademark of mixer by PRIMIX Corporation) and the like.

It is preferred that the silicone composition of the present invention have an absolute viscosity of 3.0 to 500 Pa·s, more preferably 10 to 300 Pa·s when measured at 25° C. An absolute viscosity below 3.0 Pa·s may lead to an unfavorable workability such as that incurred by the difficulty in retaining a shape. Further, an absolute viscosity greater than 500 Pa·s may also lead to an unfavorable workability such as that incurred by the difficulty in performing ejection. The absolute viscosity can be obtained by controlling the combination of all the aforementioned components. In the present invention, the absolute viscosity refers to a value measured using a Malcom viscometer at 25° C. (10 rpm with rotor A, shear rate 6 [l/s]).

The silicone composition of the present invention can be suitably used as a composition that is to be placed between a heated part such as an electronic part (e.g. LSI) and a cooling member to dissipate a heat transferred from the heated part to the cooling member. In fact, the silicone composition of the present invention can be used in a way similar to that of a conventional thermal conductive silicone grease. For example, the silicone composition of the present invention may be either cured by a heat generated from a heated part such as an electronic part; or proactively cured with heat after being applied. That is, there can be provided a semiconductor device with the cured product of the silicone composition of the present invention being placed between a heated part and a cooling member. Although there are no particular restrictions on the condition(s) for curing the silicone composition of the present invention with heat, it is normally heated at 80 to 200° C., preferably 100 to 180° C.; for 30 min to 4 hours, preferably for 30 min to 2 hours.

Since the silicone composition of the present invention has a high thermal conductivity and a favorable adhesiveness, it can be particularly favorably used as a heat dissipation grease for use in a high-grade semiconductor device or the like.

WORKING EXAMPLE

The present invention is described in detail hereunder with reference to working and comparative examples. However, the present invention is not limited to the following working examples. A kinetic viscosity hereunder is a value measured by an Ubbelohde-type Ostwald viscometer (Sibata scientific technology Ltd.) at 25° C.

Component (A)

A-1: A dimethylpolysiloxane with both terminal ends being blocked by a dimethylvinylsilyl group(s), and exhibiting a kinetic viscosity of 600 mm²/s at 25° C.

Component (B)

B-1: A silicone resin represented by the following average composition formula: and exhibiting a kinetic viscosity of 3.0 mm²/s when dissolved in a xylene solvent to obtain a solution of 50% by mass

B-2: A silicone resin represented by the following average composition formula: and exhibiting a kinetic viscosity of 1.5 mm²/s when dissolved in a xylene solvent to obtain a solution of 50% by mass

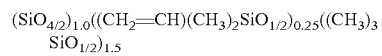

Component (C)

C-1: An aluminum powder (thermal conductivity: 237 W/m·° C.) prepared by previously mixing an aluminum powder of an average particle diameter of 20.0 μm and an aluminum powder of an average particle diameter of 2.0 μm at a ratio of 60:40 by mass C-2: A zinc oxide powder of an average particle diameter of 1.0 μm (thermal conductivity: 25 W/m·° C.)

Component (D) and Comparative Component

D-1:

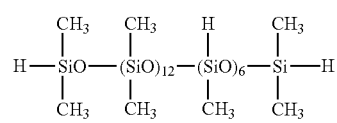

D-2:

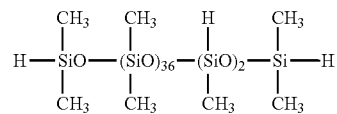

D-3:

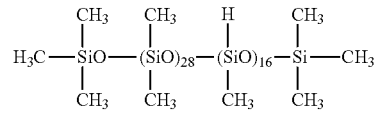

D-4:

(Chemical formula 13)

$$H-\underset{\underset{CH_3}{|}}{\overset{\overset{CH_3}{|}}{Si}}O-(\underset{\underset{CH_3}{|}}{\overset{\overset{CH_3}{|}}{Si}}O)_{10}-(\underset{\underset{CH_3}{|}}{\overset{\overset{H}{|}}{Si}}O)_{38}-\underset{\underset{CH_3}{|}}{\overset{\overset{CH_3}{|}}{Si}}-H$$

Component (E)
E-1:

(Chemical formula 14)

[cyclic siloxane structure with epoxy-propyl-oxy group]

Component (F)
F-1:

(Chemical formula 15)

$$(H_3CO)_3Si-(\underset{\underset{CH_3}{|}}{\overset{\overset{\text{vinyl}}{|}}{Si}}O)_1-(\underset{\underset{CH_3}{|}}{\overset{\overset{CH_3}{|}}{Si}}O)_{10}-Si(OCH_3)_3$$

Component (G)
G-1: A solution with a platinum-divinyltetramethyldisiloxane complex being dissolved in a dimethylpolysiloxane identical to A-1 (platinum atom content: 1% by mass)
Component (H)
H-1:

(Chemical formula 16)

$$H_3C-\underset{\underset{C\equiv CH}{|}}{\overset{\overset{C_{10}H_{21}}{|}}{C}}-OH$$

Component (I)
I-1:

(Chemical formula 17)

$$H_3C-\underset{\underset{CH_3}{|}}{\overset{\overset{CH_3}{|}}{Si}}O-(\underset{\underset{CH_3}{|}}{\overset{\overset{CH_3}{|}}{Si}}O)_{30}-\underset{\underset{OCH_3}{|}}{\overset{\overset{OCH_3}{|}}{Si}}-OCH_3$$

Component (J)
J-1:

(Chemical formula 18)

[triallyl isocyanurate structure]

Working Examples 1 to 10; Comparative Examples 1 to 11

Preparation of Silicone Composition

Silicone compositions were prepared by blending the components (A) to (J) in accordance with the amounts shown in the Tables 1 to 3 and a method described below. Here, in the tables, the mass of the component (G) refers to the mass of the solution with the platinum-divinyltetramethyldisiloxane complex being dissolved in the dimethylpolysiloxane (platinum atom content: 1% by mass). Further, SiH/SiVi represents a ratio of the total number of the SiH groups in the components (D) and (E) to the total number of the alkenyl groups in the components (A), (B) and (F). Furthermore, (D) SiH/(D) SiH+(E) SiH represents a ratio of the number of the SiH groups in the component (D) to the total number of the SiH groups in the components (D) and (E).

The components (A), (B), (C), (F) and (I) were added into a planetary mixer of 5 liter (by Inoue Mfg., Inc), and mixed together at 170° C. for an hour. A product thus obtained was then cooled to a normal temperature, and the components (D), (E), (G), (H) and (J) were further added thereto to mix the same until they had been uniformly mixed with one another. In this way, a silicone composition was prepared.

With regard to each silicone composition obtained by the aforementioned method, there were measured a viscosity, a thermal conductivity, an elongation at break and an adhesion strength in accordance with the methods below. The results thereof are shown in Table 1 and Table 2.
(Viscosity)

An absolute viscosity of each composition was measured using a Malcom viscometer (type PC-1T) at 25° C.
(Thermal Conductivity)

A thermal conductivity of each composition being wrapped in a kitchen wrap was measured using TPA-501 (by Kyoto electronics manufacturing Co., Ltd).
(Elongation at Break)

Each composition was heated at 150° C. for 60 min to cure the same and produce a sheet of a thickness of 2 mm. Further, there were also prepared specimens of the shape of Dumbbell No. 2 in accordance with JIS K6251, and the elongation of the composition at break was then measured.
(Adhesion Strength)

Each composition was sandwiched between a silicon wafer of a size of 1 mm×1 mm and a nickel plate, followed by heating the same at 150° C. for 60 min while pressurizing the same with a clip of 1.8 kgf. The adhesion strength of the composition was then measured using Dage series-4000PXY (by Dage Deutchland GmbH).

TABLE 1

|  |  | Working example | | | | | | | | | |
|---|---|---|---|---|---|---|---|---|---|---|---|
|  |  | 1 | 2 | 3 | 4 | 5 | 6 | 7 | 8 | 9 | 10 |
| Composition (part by mass) | A-1 | 90 | 90 | 100 | 90 | 90 | 90 | 90 | 90 | 90 | 90 |
|  | B-1 | 10 |  |  | 10 | 10 | 10 | 10 | 10 | 10 | 10 |
|  | B-2 |  | 10 |  |  |  |  |  |  |  |  |
|  | C-1 | 628 | 628 | 628 | 419 | 942 | 628 | 628 | 628 | 628 | 628 |
|  | C-2 | 139 | 139 | 139 | 93 | 209 | 139 | 139 | 139 | 139 | 139 |
|  | Total amount of filler | 767 | 767 | 767 | 512 | 1151 | 767 | 767 | 767 | 767 | 767 |
|  | D-1 | 3.2 | 3.2 | 2.8 | 3.8 | 3.2 |  | 6.0 | 2.0 | 4.9 | 1.2 |
|  | D-2 |  |  |  |  |  | 11.7 |  |  |  |  |
|  | D-3 |  |  |  |  |  |  |  |  |  |  |
|  | D-4 |  |  |  |  |  |  |  |  |  |  |
|  | E-1 | 2.1 | 2.1 | 1.8 | 2.1 | 2.1 | 2.1 | 3.9 | 1.3 | 0.8 | 3.2 |
|  | F-1 | 3.0 | 3.0 | 7.0 | 3.0 | 3.0 | 3.0 | 3.0 | 3.0 | 3.0 | 3.0 |
|  | G-1 | 0.4 | 0.4 | 0.20 | 0.4 | 0.4 | 0.4 | 0.4 | 0.4 | 0.4 | 0.4 |
|  | H-1 | 0.8 | 0.8 | 0.5 | 0.8 | 0.8 | 0.8 | 0.8 | 0.8 | 0.8 | 0.8 |
|  | I-1 | 8.0 | 8.0 | 7.0 | 8.0 | 20 | 8.0 | 8.0 | 8.0 | 8.0 | 8.0 |
|  | J-1 |  |  | 0.4 |  |  |  |  |  |  |  |
|  | SiH/SiVi | 1.6 | 1.3 | 1.3 | 1.6 | 1.6 | 1.6 | 3.0 | 1.0 | 1.6 | 1.6 |
|  | (D) SiH/ (D) SiH + (E) SiH | 0.5 | 0.5 | 0.5 | 0.5 | 0.5 | 0.5 | 0.5 | 0.5 | 0.8 | 0.2 |
| Evaluation result | Absolute viscosity (Pa · s) | 95 | 88 | 86 | 80 | 255 | 80 | 77 | 114 | 90 | 120 |
|  | Thermal conductivity (W/m · °C.) | 3.0 | 2.9 | 2.8 | 2.0 | 4.0 | 2.8 | 2.8 | 3.0 | 2.9 | 3.0 |
|  | Elongation(%) | 29 | 25 | 44 | 33 | 26 | 38 | 36 | 51 | 38 | 19 |
|  | Adhesion strength (N) | 409 | 380 | 408 | 398 | 336 | 355 | 248 | 257 | 273 | 288 |

TABLE 2

|  |  | Comparative example | | | | | | | |
|---|---|---|---|---|---|---|---|---|---|
|  |  | 1 | 2 | 3 | 4 | 5 | 6 | 7 | 8 |
| Composition (part by mass) | A-1 | 40 | 90 | 90 | 90 | 90 | 90 | 90 | 90 |
|  | B-1 | 60 | 10 | 10 | 10 | 10 | 10 | 10 | 10 |
|  | B-2 |  |  |  |  |  |  |  |  |
|  | C-1 | 628 | 1696 | 628 | 628 | 628 | 628 | 628 | 628 |
|  | C-2 | 139 | 375 | 139 | 139 | 139 | 139 | 139 | 139 |
|  | Total amount of filler | 767 | 2071 | 767 | 767 | 767 | 767 | 767 | 767 |
|  | D-1 |  | 5.6 | 3.2 |  |  | 5.8 | 0.6 | 6.4 | 8.0 |
|  | D-2 |  |  |  |  |  |  |  |  |
|  | D-3 |  |  |  | 3.2 |  |  |  |  |
|  | D-4 |  |  |  |  | 1.4 |  |  |  |
|  | E-1 |  | 3.0 | 2.1 | 2.1 | 2.1 | 0.4 | 3.8 | 4.2 | 5.3 |
|  | F-1 |  | 3.0 | 3.0 | 3.0 | 3.0 | 3.0 | 3.0 | 60 | 3.0 |
|  | G-1 |  | 0.4 | 0.4 | 0.4 | 0.4 | 0.4 | 0.4 | 0.4 | 0.4 |
|  | H-1 |  | 0.8 | 0.8 | 0.8 | 0.8 | 0.8 | 0.8 | 0.8 | 0.8 |
|  | I-1 |  | 8.0 | 20 | 8.0 | 8.0 | 8.0 | 8.0 | 8.0 | 8.0 |
|  | J-1 |  |  |  |  |  |  |  |  |
|  | SiH/SiVi |  | 1.6 | 1.6 | 1.6 | 1.6 | 1.6 | 1.6 | 0.8 | 4.0 |
|  | (D) SiH/ (D) SiH + (E) SiH |  | 0.5 | 0.5 | 0.5 | 0.5 | 0.9 | 0.1 | 0.5 | 0.5 |
| Evaluation result | Absolute viscosity (Pa · s) | Unable to form grease | Unable to form grease | 108 | 120 | 88 | 131 | 30 | 71 |
|  | Thermal conductivity (W/m · °C.) |  |  | 3.0 | 2.9 | 3.0 | 3.0 | 2.0 | 2.7 |
|  | Elongation(%) |  |  | 26 | 20 | 42 | 14 | 21 | 20 |
|  | Adhesion strength (N) |  |  | 213 | 189 | 207 | 220 | 154 | 149 |

TABLE 3

|  |  | Comparative example | | |
|---|---|---|---|---|
|  |  | 9 | 10 | 11 |
| Composition (part by mass) | A-1 | 90 | 90 | 90 |
|  | B-1 | 10 | 10 | 10 |
|  | B-2 |  |  |  |
|  | C-1 | 628 | 628 | 628 |
|  | C-2 | 139 | 139 | 139 |
|  | Total amount of filler | 767 | 767 | 767 |
|  | D-1 | 6.2 | 3.2 | 6.2 |
|  | D-2 |  |  |  |
|  | D-3 |  |  |  |
|  | D-4 |  |  |  |
|  | E-1 | 0 | 2.1 | 0 |
|  | F-1 | 3.0 | 0 | 0 |
|  | G-1 | 0.4 | 0.4 | 0.4 |
|  | H-1 | 0.8 | 0.8 | 0.8 |
|  | I-1 | 8.0 | 8.0 | 8.0 |
|  | J-1 |  |  |  |
|  | SiH/ SiVi | 1.6 | 2.0 | 1.9 |
|  | (D) SiH/(D) SiH + (E) SiH | 1.0 | 0.5 | 1.0 |
| Evaluation result | Absolute viscosity (Pa · s) | 100 | 83 | 87 |
|  | Thermal conductivity (W/m · ° C.) | 3.0 | 3.0 | 3.0 |
|  | Elongation(%) | 38 | 26 | 30 |
|  | Adhesion strength (N) | 213 | 224 | 144 |

As shown in Tables 1 to 3, it is obvious that the silicone compositions of the working examples 1 to 10 exhibit adhesion strengths larger than those of the comparative examples 1 to 11.

Meanwhile, the compositions failed to be turned into greases in the comparative example 1 where the component B-1 was used in an amount of as much as 60 parts by mass with respect to 100 parts by mass of the sum total of the components A-1 and B-1; and the comparative example 2 where the filler of the components C-1 and C-2 is used in an amount of as much as 2071 parts by mass with respect to 100 parts by mass of the sum total of the components A-1 and B-1.

Further, the compositions exhibited low adhesion strengths in the comparative example 3 where the component D-3 used as a cross-linking agent did not have a SiH group(s) at the terminal end(s) of its molecular chain; and the comparative example 4 where the component D-4 used as a cross-linking agent did not satisfy n/(n+m)≤0.5 and 0.5≤n/(number of SiH groups present in terminal end groups i.e. 2)≤10.

Furthermore, the compositions exhibited low adhesion strengths in the comparative example 5 where the ratio of the number of the SiH groups in the component D-1 to the total number of the SiH groups in the components D-1 and E-1 was 0.9; and the comparative example 6 where such ratio was 0.1.

Furthermore, the compositions exhibited low adhesion strengths in the comparative example 7 where the component F-1 was used in an amount of as much as 60 parts by mass with respect to 100 parts by mass of the sum total of the components A-1 and B-1, and where SiH/SiVi was as low as 0.8; and the comparative example 8 where SiH/SiVi was as high as 4.0.

Furthermore, the compositions exhibited low adhesion strengths in the comparative example 9 where no component E-1 was added; the comparative example 10 where no component F-1 was added; and the comparative example 11 where neither the component E-1 nor the component F-1 was added.

Through the aforementioned experiments, it was confirmed that the silicone composition of the present invention could still exhibit a favorable adhesiveness even when containing a large amount of a thermal conductive filler, in a case where the silicone composition was used to solidly bond a semiconductor chip and a heat spreader to each other.

What is claimed:
1. A silicone composition comprising:
(A) an organopolysiloxane having at least two aliphatic unsaturated hydrocarbon groups in one molecule and exhibiting a kinetic viscosity of 60 to 100,000 mm$^2$/s at 25° C., said organopolysiloxane being in an amount of 100 parts by mass;
(B) a silicone resin having at least one aliphatic unsaturated hydrocarbon group in one molecule, said silicone resin being in an amount of 0 to 100 parts by mass with respect to 100 parts by mass of the component (A);
(C) a filler including an aluminum powder and a zinc oxide powder, said filler being in an amount of 100 to 2,000 parts by mass with respect to 100 parts by mass of a sum total of the components (A) and (B);
(D) an organohydrogenpolysiloxane represented by the following general formula (1):

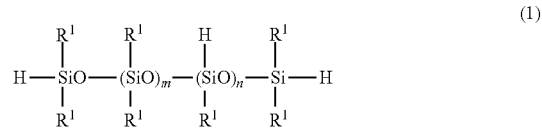

(1)

wherein n and m satisfy 5.0≤n+m≤100, n/(n+m)≤0.5 and 0.5≤n/(number of SiH groups present in terminal end groups i.e. 2)≤10; each R$^1$ independently represents an alkyl group having 1 to 6 carbon atoms;
(E) an organohydrogenpolysiloxane represented by the following general formula (2):

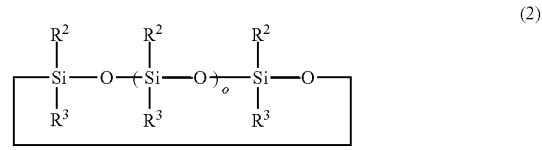

(2)

wherein o represents an integer of 2 to 8; each R$^2$ independently represents a hydrogen atom or R$^4$, provided that 2 to 3 of the groups represented by R$^2$ are hydrogen atoms; said R$^4$ is a group selected from an epoxyalkoxyalkyl group, an acryloyl group, a methacryloyl group and a trialkoxysilyl group; each R$^3$ independently represents an alkyl group having 1 to 6 carbon atoms;
(F) a hydrolyzable organopolysiloxane represented by the following general formula (3):

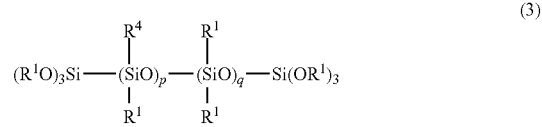

(3)

wherein p and q satisfy 5.0≤p+q≤100; each R$^1$ independently represents an alkyl group having 1 to 6 carbon atoms; R$^4$ represents an alkenyl group having 2 to 6 carbon atoms, said hydrolyzable organopolysiloxane being in an amount of 1 to 50 parts by mass with respect to 100 parts by mass of the sum total of the components (A) and (B);

(G) a platinum group metal catalyst of an effective amount; and (H) a reaction control agent of an amount of 0.05 to 5.0 parts by mass, wherein a total amount of the components (D) and (E) is such that (total number of SiH groups in components (D) and (E))/(total number of aliphatic unsaturated hydrocarbon groups in components (A), (B) and (F)) is in a range of 1.0 to 3.0; and that (number of SiH groups in component (D))/(number of SiH groups in components (D) and (E)) is in a range of 0.2 to 0.8.

2. The silicone composition according to claim 1, further comprising (I) a hydrolyzable methylpolysiloxane represented by the following general formula (4):

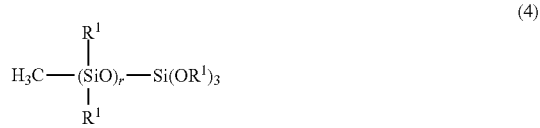

(4)

wherein each $R^1$ independently represents an alkyl group having 1 to 6 carbon atoms; r represents an integer of 5 to 100, said hydrolyzable methylpolysiloxane being in an amount of 1 to 50 parts by mass with respect to 100 parts by mass of the sum total of the components (A) and (B).

3. The silicone composition according to claim 1, further comprising (J) an adhesion aid having, in one molecule, a triazine ring and at least one aliphatic unsaturated hydrocarbon group that may contain an oxygen atom, said adhesion aid being in an amount of 0.05 to 0.5 parts by mass with respect to 100 parts by mass of the sum total of the components (A) and (B).

4. The silicone composition according to claim 2, further comprising (J) an adhesion aid having, in one molecule, a triazine ring and at least one aliphatic unsaturated hydrocarbon group that may contain an oxygen atom, said adhesion aid being in an amount of 0.05 to 0.5 parts by mass with respect to 100 parts by mass of the sum total of the components (A) and (B).

5. The silicone composition according to claim 1, wherein said silicone resin (B) includes an $SiO_{4/2}$ unit, an $R^5_2R^6SiO_{1/2}$ unit and an $R^5_3SiO_{1/2}$ unit, and wherein each $R^5$ independently represents a monovalent hydrocarbon group having no aliphatic unsaturated bond, $R^6$ represents an aliphatic unsaturated hydrocarbon group and (total number of $R^5_2R^6SiO_{1/2}$ and $R^5_3SiO_{1/2}$ units)/(number of $SiO_{4/2}$ units) is in a range of 0.1 to 3.0.

6. The silicone composition according to claim 2, wherein said silicone resin (B) includes an $SiO_{4/2}$ unit, an $R^5_2R^6SiO_{1/2}$ unit and an $R^5_3SiO_{1/2}$ unit, and wherein each $R^5$ independently represents a monovalent hydrocarbon group having no aliphatic unsaturated bond, $R^6$ represents an aliphatic unsaturated hydrocarbon group and (total number of $R^5_2R^6SiO_{1/2}$ and $R^5_3SiO_{1/2}$ units)/(number of $SiO_{4/2}$ units) is in a range of 0.1 to 3.0.

7. The silicone composition according to claim 3, wherein said silicone resin (B) includes an $SiO_{4/2}$ unit, an $R^5_2R^6SiO_{1/2}$ unit and an $R^5_3SiO_{1/2}$ unit, and wherein each $R^5$ independently represents a monovalent hydrocarbon group having no aliphatic unsaturated bond, $R^6$ represents an aliphatic unsaturated hydrocarbon group and (total number of $R^5_2R^6SiO_{1/2}$ and $R^5_3SiO_{1/2}$ units)/(number of $SiO_{4/2}$ units) is in a range of 0.1 to 3.0.

8. The silicone composition according to claim 4, wherein said silicone resin (B) includes an $SiO_{4/2}$ unit, an $R^5_2R^6SiO_{1/2}$ unit and an $R^5_3SiO_{1/2}$ unit, and wherein each $R^5$ independently represents a monovalent hydrocarbon group having no aliphatic unsaturated bond, $R^6$ represents an aliphatic unsaturated hydrocarbon group and (total number of $R^5_2R^6SiO_{1/2}$ and $R^5_3SiO_{1/2}$ units)/(number of $SiO_{4/2}$ units) is in a range of 0.1 to 3.0.

9. The silicone composition according to claim 1, wherein said reaction control agent (H) is selected from the group consisting of an acetylene compound, a nitrogen compound, an organic phosphorous compound, an oxime compound and an organic chloro compound.

10. The silicone composition according to claim 2, wherein said reaction control agent (H) is selected from the group consisting of an acetylene compound, a nitrogen compound, an organic phosphorous compound, an oxime compound and an organic chloro compound.

11. The silicone composition according to claim 3, wherein said reaction control agent (H) is selected from the group consisting of an acetylene compound, a nitrogen compound, an organic phosphorous compound, an oxime compound and an organic chloro compound.

12. The silicone composition according to claim 4, wherein said reaction control agent (H) is selected from the group consisting of an acetylene compound, a nitrogen compound, an organic phosphorous compound, an oxime compound and an organic chloro compound.

13. The silicone composition according to claim 5, wherein said reaction control agent (H) is selected from the group consisting of an acetylene compound, a nitrogen compound, an organic phosphorous compound, an oxime compound and an organic chloro compound.

14. The silicone composition according to claim 6, wherein said reaction control agent (H) is selected from the group consisting of an acetylene compound, a nitrogen compound, an organic phosphorous compound, an oxime compound and an organic chloro compound.

15. The silicone composition according to claim 7, wherein said reaction control agent (H) is selected from the group consisting of an acetylene compound, a nitrogen compound, an organic phosphorous compound, an oxime compound and an organic chloro compound.

16. The silicone composition according to claim 8, wherein said reaction control agent (H) is selected from the group consisting of an acetylene compound, a nitrogen compound, an organic phosphorous compound, an oxime compound and an organic chloro compound.

17. The silicone composition according to claim 1, wherein said organopolysiloxane (A) has a linear structure in which a main chain consists of recurring units of diorganosiloxane, and both molecular chain terminal ends are blocked by triorganosiloxy groups.

18. The silicone composition according to claim 1, wherein said silicone resin (B) has an aliphatic unsaturated hydrocarbon group in an amount of $1 \times 10^{-5}$ to $1 \times 10^{-2}$ mol/g.

19. The silicone composition according to claim 1, wherein the zinc oxide powder of said filler (C) has an average particle diameter of 0.1 to 10 µm; and the aluminum powder of said filler (C) is a mixed aluminum powder of an aluminum powder having a large average particle diameter of 5 µm to 100 µm and an aluminum powder having a small average particle diameter of not smaller than 0.1 µm but smaller than 10 µm, a mass ratio of the aluminum powder having the large average particle diameter to the aluminum powder having the small average particle diameter being 0.5 to 9.0.

20. The silicone composition according to claim 1, wherein a mass ratio of the aluminum powder to the zinc oxide powder of said filler (C), (aluminum powder)/(zinc oxide powder), is in a range of 1 to 10.

* * * * *